(12) United States Patent
Yoshimura et al.

(10) Patent No.: US 9,048,056 B2
(45) Date of Patent: *Jun. 2, 2015

(54) GLASS COMPOSITION AND COVERING AND SEALING MEMBERS USING SAME

(75) Inventors: Kei Yoshimura, Inba (JP); Shinichi Tachizono, Narita (JP); Yuji Hashiba, Narita (JP); Takashi Naito, Funabashi (JP); Takuya Aoyagi, Hitachi (JP)

(73) Assignee: HITACHI POWDERED METALS CO., LTD., Chiba (JP)

( * ) Notice: Subject to any disclaimer, the term of this patent is extended or adjusted under 35 U.S.C. 154(b) by 661 days.

This patent is subject to a terminal disclaimer.

(21) Appl. No.: 13/259,647

(22) PCT Filed: Mar. 26, 2010

(86) PCT No.: PCT/JP2010/002186
§ 371 (c)(1),
(2), (4) Date: Nov. 29, 2011

(87) PCT Pub. No.: WO2010/109903
PCT Pub. Date: Sep. 30, 2010

(65) Prior Publication Data
US 2012/0063076 A1 Mar. 15, 2012

(30) Foreign Application Priority Data
Mar. 27, 2009 (JP) ................. 2009-078957

(51) Int. Cl.
*C03C 3/12* (2006.01)
*B32B 17/06* (2006.01)
*H05K 5/02* (2006.01)
*H01J 5/24* (2006.01)
*C03C 3/21* (2006.01)
*C03C 4/16* (2006.01)
*C03C 8/08* (2006.01)
*C03C 8/24* (2006.01)
*H01J 11/48* (2012.01)
*H01L 23/29* (2006.01)

(52) U.S. Cl.
CPC ................ *H01J 5/24* (2013.01); *Y10T 428/252* (2015.01); *C03C 3/21* (2013.01); *C03C 4/16* (2013.01); *C03C 8/08* (2013.01); *C03C 8/24* (2013.01); *H01J 11/48* (2013.01); *H01L 23/291* (2013.01); *H01L 2924/09701* (2013.01)

(58) Field of Classification Search
None
See application file for complete search history.

(56) References Cited

U.S. PATENT DOCUMENTS

| 8,367,573 B2 * | 2/2013 | Naito et al. ............... 501/46 |
| 2006/0003883 A1 * | 1/2006 | Yoshida et al. ............ 501/46 |
| 2008/0106194 A1 * | 5/2008 | Logunov et al. .......... 313/512 |
| 2009/0199897 A1 * | 8/2009 | Naito et al. ............. 136/256 |
| 2009/0275461 A1 * | 11/2009 | Sawada et al. ............ 501/46 |
| 2010/0180934 A1 * | 7/2010 | Naito et al. ............. 136/252 |
| 2012/0067415 A1 | 3/2012 | Tachizono |

FOREIGN PATENT DOCUMENTS

| JP | 03-127630 | 5/1991 |
| JP | 07-069672 | 3/1995 |
| JP | 10-139478 | 5/1998 |
| JP | 2000-348630 | 12/2000 |
| JP | 2004-250276 | 9/2004 |
| JP | 2006-169047 | 6/2006 |
| JP | 2006-342044 | 12/2006 |
| JP | 2007-059380 | 3/2007 |
| JP | 2007-182347 | 7/2007 |
| JP | 2008-185852 | 8/2008 |
| JP | 2008-543080 | 11/2008 |
| JP | 2009-209032 | 9/2009 |
| JP | 2009-221049 | 10/2009 |
| JP | 2009221047 A * | 10/2009 |
| JP | 2009221048 A * | 10/2009 |
| WO | WO 2005/000755 A1 | 1/2005 |
| WO | WO 2006/132766 A2 | 12/2006 |

OTHER PUBLICATIONS

Machine translation JP2009-221049, Masuda, Jan. 10, 2009.*

* cited by examiner

*Primary Examiner* — David Sample
(74) *Attorney, Agent, or Firm* — Fitch, Even, Tabin & Flannery

(57) ABSTRACT

A glass composition according to the present invention comprises: transition metals; phosphorus; barium; and zinc, the transition metals including: vanadium; and tungsten and/or iron, the glass composition not containing substances included in the JIG level A and B lists, an softening point of the glass composition being from 430 to 530° C., an average linear expansion coefficient of the glass composition being from 6 to 9 ppm/° C. at temperatures from 30 to 250° C.

20 Claims, 2 Drawing Sheets

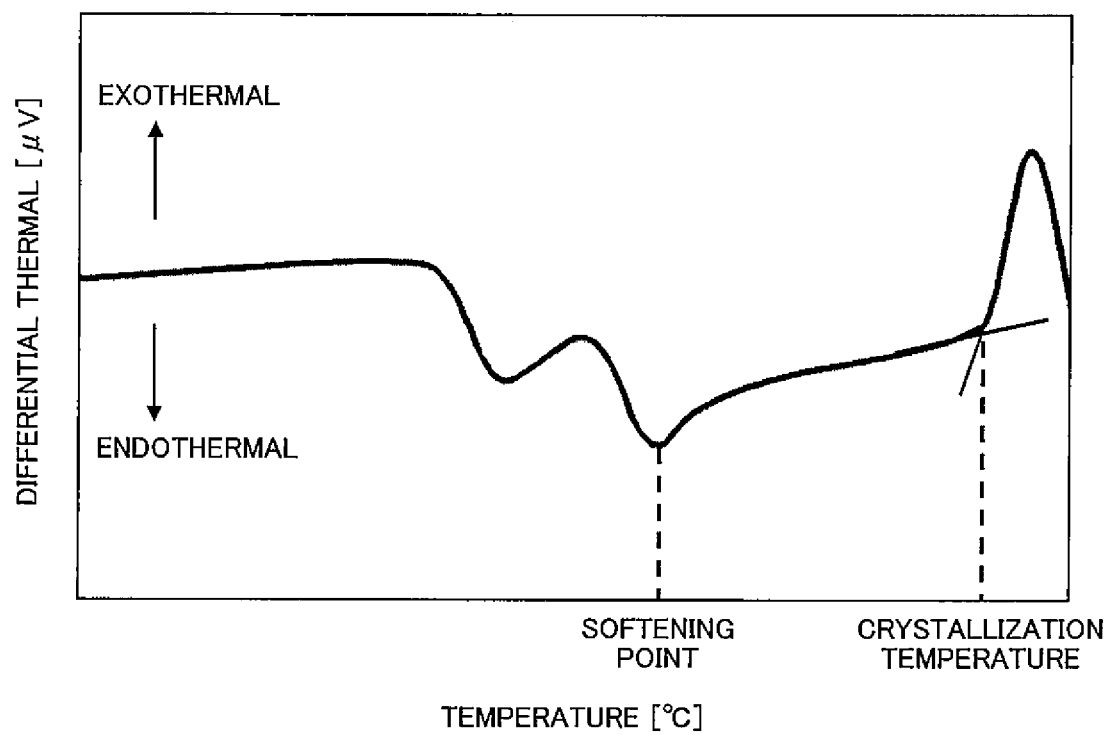

GLASS COMPOSITION AND COVERING AND SEALING MEMBERS USING SAME

TECHNICAL FIELD OF THE INVENTION

The present invention relates to glass compositions, and particularly to glass compositions which soften around 500° C. and do not contain lead. The invention also relates to coating and sealing members containing the glass composition of the invention.

DESCRIPTION OF BACKGROUND ART

Display devices such as PDPs (plasma display panels) comprise: a front panel having electrodes, a dielectric layer and others on a transparent insulating substrate (such as a glass substrate); and, facing the front panel, a back panel having electrodes, a dielectric layer, barrier ribs, phosphors, and others on another transparent insulating substrate. And, the periphery of the two panels is sealed airtight. After or during the sealing process, the space between the two panels is evacuated and a discharge gas is introduced into this space. By contrast, in field emission type and electron emission type displays, the space between the front and back panels needs to be maintained in a high vacuum, and therefore air tightness along the periphery of the two panels is more vital.

In display devices such as PDPs as described above, glass compositions which soften at relatively low temperatures are used to form various parts such as the electrodes, dielectric layer and barrier ribs, and are also used as a sealant to seal the display panel. For example, coating members containing a glass composition that softens at about 550° C. are used to form the dielectric layer. Such a dielectric layer is formed by applying a glass paste over the electrodes on the glass substrate using screen printing or the like, followed by drying and heat treatment.

To seal the display panel, sealing members (sealants) containing a glass composition which softens at a temperature lower than about 500° C. are often used. Conventionally used sealants are glass compositions prepared by mixing a glass containing lead oxide as a major constituent and a filler. The sealing process includes the steps of: applying a glass paste along the periphery of the front or back panel and drying the applied glass paste; pre-firing the dried glass paste in an air atmosphere; embedding the front and back panels in a predetermined positional relationship to each other; and heating the pre-fired glass while evacuating the space between the two panels to complete the sealing process. Typically, the glass paste is applied using a printing or dispenser technique.

Currently, most PDPs employ an alternate current (AC) drive system. In the AC drive systems of PDPs, images are displayed by utilizing wall charges generated on the surface of the dielectric layer. Such systems have a problem in which part of the wall charges tend to remain on the surface of the dielectric layer after displaying an image, and such residual wall charges are prone to locally accumulate, thereby possibly triggering an abnormal discharge. In order to prevent such an abnormal discharge, Patent Literature 1 (JP-A 2000-348630) discloses a method for removing the above-described residual wall charges from the surface of the dielectric layer by using, as the dielectric layer, an electrically conductive glass that contains vanadium and has an electrical resistivity of $10^7$ to $10^{15}$ Ω·cm.

In these years, the use of lead-containing materials is increasingly restricted for environmental considerations. Accordingly, various lead-free glass compositions for sealing or coating purposes are being proposed. For example, Patent Literature 2 (JP-A Hei 10(1998)-139478) and Patent Literature 3 (JP-A 2006-169047) disclose a glass composition containing bismuth oxide as a major constituent. Patent Literature 4 (JP-A Hei 7(1995)-69672) discloses a glass composition containing tin oxide as a major constituent. Patent Literature 5 (JP-A 2007-182347), Patent Literature 6 (JP-A 2006-342044) and Patent Literature 7 (JP-A 2008-185852) disclose a glass composition containing vanadium oxide as a major constituent.

Patent Literature 1: Japanese Patent Laid-open No. 2000-348630
Patent Literature 2: Japanese Patent Laid-open No. Hei 10(1998)-139478
Patent Literature 3: Japanese Patent Laid-open No. 2006-169047
Patent Literature 4: Japanese Patent Laid-open No. Hei 7(1995)-69672
Patent Literature 5: Japanese Patent Laid-open No. 2007-182347
Patent Literature 6: Japanese Patent Laid-open No. 2006-342044
Patent Literature 7: Japanese Patent Laid-open No. 2008-185852

DISCLOSURE OF THE INVENTION

Problems to be Solved by the Invention

As described above, with a strong worldwide trend towards green (environmentally friendly) procurements and designs in the electrical and electronic device industry, there is a great need for environmentally safer materials. Europe enforces "DIRECTIVE 2002/95/EC OF THE EUROPEAN PARLIAMENT AND OF THE COUNCIL of 27 Jan. 2003 on the restriction of the use of certain hazardous substances in electrical and electronic equipment" (the RoHS directive adopted by the European Union). On the other hand, an electronic industry group in Japan has issued, jointly with industry groups in the U.S. and Europe, the Joint Industry Guide for Material Composition Declaration for Electronic Products (JIG). Bismuth contained in lead-free bismuth-based glasses and antimony contained in lead-free antimony-based glasses, the use of which are currently not restricted under the RoHS directive, are included in the JIG level B list of survey target chemical substances.

Examples of the JIG level A substances include: asbestos, certain azocolourants and azodyes, cadmium/cadmium compounds, hexavalent chromium/hexavalent chromium compounds, lead/lead compounds, mercury/mercury compounds, ozone depleting substances (such as CFCs, HCFCs, HBFCs and carbon tetrachloride), polybrominated biphenyls (PBBs), polybrominated diphenyl ethers (PBDEs), polychlorinated biphenyls (PCBs), polychlorinated naphthalenes (three or more chlorine atoms), radioactive substances, certain shortchain chlorinated paraffins, tributyl tin (TBT), triphenyl tin (TPT), and tributyl tin oxide (TBTO).

Furthermore, examples of the JIG level B substances include: bismuth/bismuth compounds, antimony/antimony compounds, arsenic/arsenic compounds, beryllium/beryllium compounds, brominated flame retardants (other than PBBs and PBDEs), nickel, certain phthalates, selenium/selenium compounds, and polyvinyl chloride (PVC).

The methods described in the above disclosures have the following problems: When a (glass) substrate having silver electrodes on its surface is coated with the vanadium-containing electrically conductive glass disclosed in the above Patent Literature 1 (JP-A 2000-348630), the vanadium contained in the conductive glass is prone to chemically react with the underlying silver electrodes during the heating process for forming the coating, thus degrading the electrical conductance of the silver electrodes. In this method, if the content of vanadium is reduced to suppress such a chemical reaction, instead a large amount of lead or bismuth needs to be added to the glass composition in order to lower the softening point of the glass composition below 600° C. Thus, the RoHS directive or the JIG requirement cannot be satisfied.

The glass compositions disclosed in the above Patent Literature 2 (JP-A Hei 10(1998)-139478) and Patent Literature 3 (JP-A 2000-169047) have, as a major constituent, bismuth oxide included in the JIG level B list. The glass composition disclosed in the above Patent Literature 4 (JP-A Hei 7(1995)-69672) contains tin as a major constituent and does not contain JIG level A or B substances. However, such a glass composition has the following problem with poor moisture resistance: In some processes for sealing electronic devices such as display devices, moisture-containing materials (such as phosphors) are fired simultaneously with the firing of the sealant used. When a low softening point glass composition containing stannous oxide (SnO) as a major constituent is used as the sealant in such a sealing process, moisture evaporated from the moisture-containing materials may corrode the sealant glass composition, thereby failing to achieve reliable sealing. A generally accepted reason for this is that stannous oxide (SnO), the backbone constituent of such a tin-containing glass composition, is oxidized to stannic oxide ($SnO_2$).

The glass composition disclosed in the above Patent Literature 5 (JP-A 2007-182347) contains vanadium oxide and tellurium oxide as major constituents, and therefore has a cost problem because tellurium is a rare metal. The vanadium phosphorus oxide-based glass composition disclosed in the above Patent Literature 6 (JP-A 2006-342044) contains bismuth oxide included in the JIG level B list. The vanadium phosphorus oxide-based glass composition disclosed in the above Patent Literature 7 (JP-A 2008-185852) contains antimony included in the JIG level B list.

In view of the above background of the invention, further effort is needed to develop glass compositions for use in electronic/electrical devices (such as display devices) which have a performance comparable or superior to that of conventional low softening point glass compositions and do not harm the environment. Accordingly, it is an objective of the present invention to provide a glass composition which softens at a relatively low temperature of around 500° C. and does not contain JIG substances such as lead, bismuth and antimony. It is another objective of the invention to provide coating and sealing members containing the glass composition of the present invention that can be advantageously used in electronic/electrical devices (such as display devices).

(1) According to one aspect of the present invention, there is provided a glass composition including: transition metals; phosphorus (P); barium (Ba); and zinc (Zn), the transition metals including: vanadium (V); and tungsten (W) and/or iron (Fe), the glass composition not containing substances included in the JIG level A and B lists, a softening point of the glass composition being from 430 to 530° C., an average linear expansion coefficient of the glass composition being from 6 to 9 ppm/° C. at temperatures from 30 to 250° C.

JIG survey target substances as used herein are the ones specified in the Japanese translation version of the JIG-101A (the revision of JIG-101) issued in 2007. See Nonpatent Document 1 below. In addition, the term "does not contain JIG level A and B substances" means "does not contain JIG level A and B substances on or above the JIG threshold levels for reporting" specified in the Japanese translation version of the JIG-101A. In other words, the glass composition according to the present invention may contain the JIG level A and B substances less than the JIG threshold levels for reporting.

Nonpatent Document 1: MATERIAL COMPOSITION DECLARATION GUIDE FOR ELECTROTECHNICAL PRODUCTS, http://210.254.215.73/jeita_eps/green/green-data/JIG200601/J IG_Japanese060105.pdf (2) According to another aspect of the present invention, there is provided a glass composition including, on the oxide basis: 25 to 43 mass % of $V_2O_5$; 0 to 25 mass % of $WO_3$; 0 to 10 mass % of $Fe_2O_3$; 23 to 30 mass % of $P_2O_5$; 5 to 20 mass % of BaO; and 5 to 15 mass % of ZnO, a total content of the $V_2O_5$, the $WO_3$, and the $Fe_2O_3$ being within a range from 40 to 60 mass %, the glass composition not containing substances included in the JIG level A and B lists.

In the above aspects (1) and (2) of the present invention, the following modifications and changes can be made.

(i) An electrical resistivity of the glass composition is from $10^8$ to $10^{10}$ Ω·cm at a temperature of 25° C.

(ii) There is provided a glass paste composition including: a resin; a solvent; and a powder of the above-described glass composition as a major constituent. Meanwhile, in the present invention, "a paste composition" is defined as a form of a liquid mixture.

(iii) There is provided a sealing member including the above-described glass composition as a major constituent. Meanwhile, in the present invention, "a sealing member" is defined as a solidified form prepared by applying and firing the above-described paste composition.

(iv) The sealing member further includes a filler powder; and content of the glass composition is from 60 to 90 vol. % and content of the filler powder is from 10 to 40 vol. %.

(v) An average particle diameter of the filler powder is from 5 to 40 μm.

(vi) There is provided a coating member including the above-described glass composition as a major constituent. Meanwhile, in the present invention, "a coating member" is defined as a solidified form prepared by applying and firing the above-described paste composition.

(vii) There is provided an electronic device including:
a glass sealant which contains the above-described glass composition and seals a portion of the electronic device;
a glass adhesive that contains the above-described glass composition and bonds different portions of the electronic device; or
a glass coating that contains the above-described glass composition and coats a portion of the electronic device.

(viii) The electronic device is a display device, an IC (integrated circuit) ceramic package, an X-ray tube, or an ozone generator.

Advantages of the Invention

According to the present invention, there can be provided a glass composition which softens at a relatively low temperature of around 500° C., and does not contain the JIG substances such as lead, bismuth and antimony. The invention can also provide coating and sealing members containing the glass composition of the invention that can be advantageously used in electronic/electrical devices (such as display devices). The glass composition of the invention, and coating and sealing members containing the invented glass composition comply with the RoHS directive, and also do not contain JIG level A and B substances, and therefore have the advantage of high environmental responsibility. In addition, the glass composition of the invention can also be applied to other purposes than coating and sealing, and products utilizing the glass composition of the invention comply with environment and safety regulations.

BRIEF DESCRIPTION OF THE DRAWINGS

FIG. 2 shows an exemplary DTA curve obtained in a DTA measurement of a glass composition.

MODE FOR CARRYING OUT THE INVENTION

Figure 1:
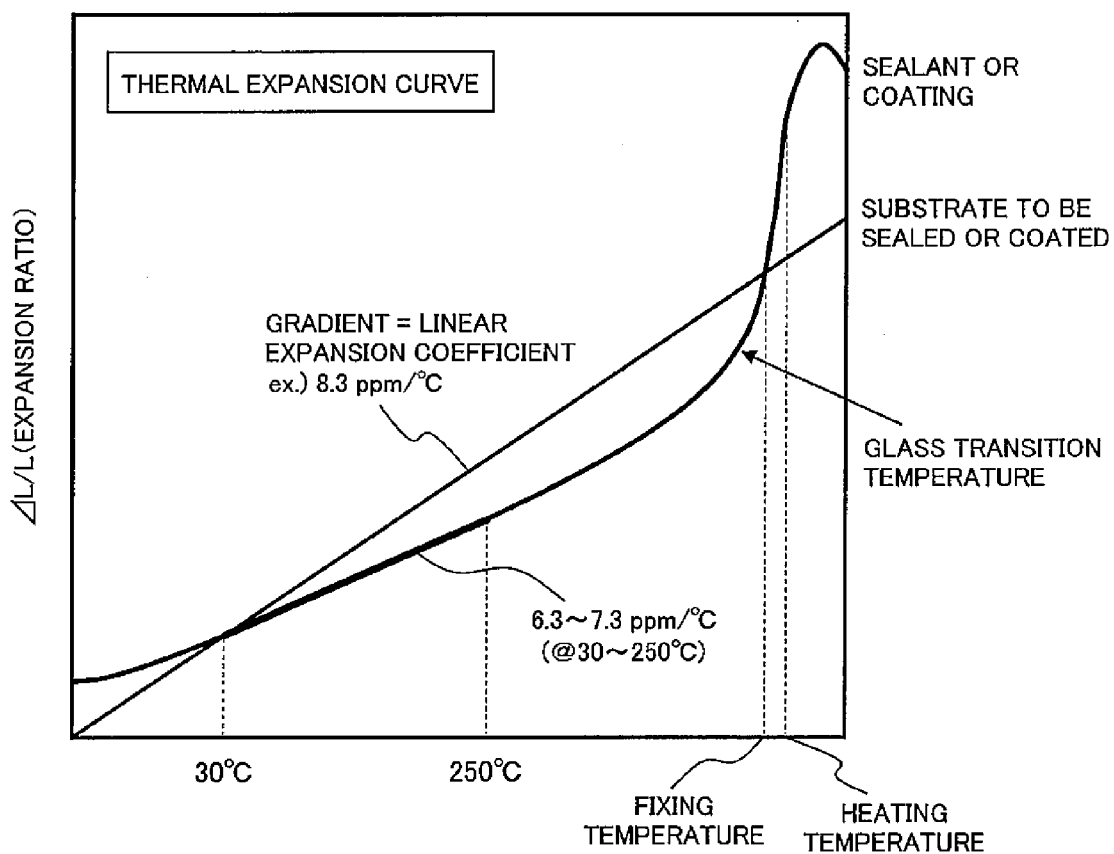
FIG. 1 is a graph schematically showing a thermal expansion curve of a sealing or coating member according to the present invention and a thermal expansion curve of a substrate to be sealed or coated.

Preferred embodiments of the present invention will be described below. The invention is not limited to the specific embodiments described herein, but various combinations of their features are possible.

(Average Composition of Glass)

The constituent of the glass composition according to the present invention will be described. The glass composition of the invention contains on average: transition metals; phosphorus (P); barium (Ba); and zinc (Zn), the transition metals including: vanadium; and tungsten and/or iron. In addition, the glass composition of the invention does not contain JIG level A and B substances. Specifically, the glass composition according to the invention contains on the oxide basis: 25 to 43 mass % of $V_2O_5$; 0 to 25 mass % of $WO_3$; 0 to 10 mass % of $Fe_2O_3$; 23 to 30 mass % of $P_2O_5$; 5 to 20 mass % of BaO; and 5 to 15 mass % of ZnO, with the total content of the $V_2O_5$, the $WO_3$, and the $Fe_2O_3$ being within a range from 40 to 60 mass %, the glass composition not containing substances included in the JIG level A and B lists.

$V_2O_5$ (vanadium pentoxide) is a backbone constituent of the glass composition, and its content is preferably from 25 to 43 mass %. At a content less than 25 mass %, the glass composition has a high softening point and cannot be molten sufficiently. At a content more than 43 mass %, the glass composition easily crystallizes resulting in excessively low electrical resistivity, and also has poor moisture resistance.

$WO_3$ (tungsten trioxide) has an effect of decreasing the average linear expansion coefficient of the glass composition. However, when its content exceeds 25 mass %, the glass composition has a high softening point. Thus, the content of $WO_3$ is preferably from 0 to 25 mass %.

$Fe_2O_3$ (ferric oxide) has an effect of lowering the softening point of the glass composition. However, when its content exceeds 10 mass %, the glass composition easily crystallizes. Thus, the content of $Fe_2O_3$ is preferably from 0 to 10 mass %.

In addition, the total content of the $V_2O_5$, the $WO_2$, and the $Fe_2O_3$ is preferably from 40 to 60 mass %. When the total content is less than 40 mass %, the glass composition has a high softening point, and therefore cannot be molten stably or uniformly. When the total content is more than 60 mass %, the glass composition has poor moisture resistance, and easily crystallizes.

$P_2O_5$ (phosphorus pentoxide) is another backbone constituent of the glass composition, and its content is preferably from 23 to 30 mass %. A content less than 23 mass % causes the glass composition to easily crystallize. A content more than 30 mass % causes the glass composition to have a high softening point.

BaO (barium oxide) is a modifier constituent (modifier oxide) of the glass composition to improve the moisture resistance. Its content is preferably from 5 to 20 mass %. A content less than 5 mass % reduces an effect improving the moisture resistance and causes the glass composition to easily crystallize. A content more than 20 mass % causes the glass composition to have a high softening point.

ZnO (zinc oxide), like BaO, is a modifier constituent (modifier oxide) of the glass composition to improve the moisture resistance, and its content is preferably from 5 to 15 mass %. A content less than 5 mass % reduces an effect improving the moisture resistance, and a content more than 15 mass % causes the glass composition to easily crystallize.

As described above, the glass composition of the present invention complies with the RoHS directive and does not contain the JIG level A and B substances, and therefore the invented glass composition is environmentally friendly as compared to conventional glass compositions.

(Softening Point of Glass Composition)

As mentioned before, in display devices such as PDPs, front and back panels, each having an electrode pattern and a dielectric layer, are disposed to face each other, and then the periphery of the two panels are sealed airtight. The glass composition of the present invention is black in color, and can therefore be suitably used as a coating member to form the dielectric layer of the back panel.

The dielectric layer is typically formed by applying a glass paste composition using screen printing or the like, followed by heating at about 550° C. In order to achieve a planar coating, the applied glass paste composition preferably has a softening point of 530° C. or less, and more preferably 500° C. or less. When the softening point is higher than 530° C., the applied glass paste composition has insufficient fluidity during heating, and as a result the resulting coating is prone to have voids or to have a nonplanar surface with asperity due to the mesh pattern of the screen mask used, and therefore it is difficult to achieve a planar coating.

In the manufacture of most PDPs, the periphery of the front and back panels is sealed while evacuating the space between the two panels and heating a sealant used for the sealing. In order to successively perform such a sealing and evacuation process, it is desired that sealant glass compositions for use in PDPs have a softening point of higher than at least 430° C. The reason for this is as follows: When the softening point of a sealant glass composition is lower than 430° C., the fluidity of the sealant glass composition is too high, and as a result the sealant glass composition is sucked off during the evacuation, thereby failing to obtain airtight sealing. In addition, when the softening point of a sealant glass composition exceeds 500° C., the sealant glass composition cannot be softened sufficiently, thus making airtight sealing difficult. Usually, the temperature used for the sealing process is lower than that used for forming the dielectric layer.

(Average Linear Expansion Coefficient of Glass Composition, Sealing Member and Coating Member)

The glass composition of the present invention preferably has an average linear expansion coefficient from 6 to 9 ppm/° C. at temperatures from 30 to 250° C. The reasons will be explained below.

Generally in a glass coating or sealing process, a coating or sealing material including a glass composition is heated up to a glass transition temperature or more of the glass composition included. After that, during cooling, the softened material adheres to a substrate to be coated or sealed, thus forming a coating or sealing member. Therefore, it is very important to adjust a relationship between thermal expansion/shrinkage of a coating or sealing member and that of a substrate to be coated or sealed.

If there is insufficient adjustment of thermal expansion/shrinkage between the coating/sealing member and the substrate to be coated/sealed, an excessive residual stress remains in the fixation region. As a result, the reliability of the coating/sealing portion is degraded. Meanwhile, from a viewpoint of mechanical strength of each member, in general, it is preferable to adjust the thermal expansion/shrinkage relationship such that a weak compressive stress is loaded to the coating/sealing member.

FIG. 1 is a graph schematically showing a thermal expansion curve of a coating or sealing member according to the present invention and a thermal expansion curve of a substrate to be coated or sealed. As shown in FIG. 1, a coating or sealing member according to the invention exhibits a thermal expansion curve having a significant slope change around the glass transition temperature. On the other hand, a general substrate to be coated or sealed exhibits a thermal expansion curve having a constant slope within a temperature range of a coating/sealing process.

Meanwhile, both a typical substrate to be sealed (e.g., a glass substrate) and a typical substrate to be coated (e.g., an alumina substrate of a ceramic package) have the average linear thermal expansion coefficient of about 8.3 ppm/° C. In order to form a glass coating or sealing member with a high reliability by satisfying a situation in that a weak compressive stress is loaded to the coating/sealing member (i.e., a weak tensile stress is loaded to the substrate to be coated/sealed), it is preferable to control the average linear thermal expansion coefficient of the coating/sealing member to be from 6.3 to 7.3 ppm/° C.

The average linear thermal expansion coefficient of the coating/sealing member can be controlled by adding a filler powder to the glass composition thereof. However, if an average linear thermal expansion coefficient of a glass composition is less than 6 ppm/° C. or more than 9 ppm/° C., there is too large a difference between the average linear expansion coefficient of the glass composition and that of a typical substrate to be sealed or coated. As a result, it is difficult to reduce such a large difference in average linear expansion coefficient (i.e., to match the average linear expansion coefficients of the two materials) by adding a filler powder to the glass composition. From the above reasons, it is preferable that the average linear expansion coefficient of the glass composition according to the invention is from 6 to 9 ppm/° C. at temperatures from 30 to 250° C.

(Sealing Member and Coating Member)

When the glass composition of the present invention is used as a sealing member (sealant), it is preferable that a filler powder is dispersed in the glass composition. Preferably, the content of the glass composition is from 60 to 90 vol. %, and the content of the filler powder is from 10 to 40 vol. %. When the content of the filler is too small, the fluidity of the sealant is too high during heating, and as a result the sealing member may be sucked off during the aforementioned evacuation process. On the contrary, too large a content of the filler will decrease the fluidity of the sealing member, thus making sufficient gas tight sealing difficult. Meanwhile, in the case of a sealing process without evacuation and in the case of a coating process for forming a dielectric layer, there is no need to add a filler powder to a glass composition when the coating/sealing member has an average linear thermal expansion coefficient of an appropriate range (e.g., from 6.3 to 7.3 ppm/° C.).

Examples of fillers used for the sealing member include, e.g., amorphous silica, alumina, cordierite, mullite, zircon, β-eucryptite, and zirconium phosphate. The average particle diameter of fillers used for the sealing member is preferably from 5 to 40 μm, and more preferably from 10 to 30 μm. Too small an average particle diameter will increase the viscosity (i.e., decrease the fluidity) of the sealing member at temperatures used to melt the sealing member. Also, the effect the filler has on adjusting the average linear expansion coefficient of the sealing member is not sufficiently obtained. On the other hand, too large an average particle diameter will increase the surface roughness of the resulting seal, thus possibly causing cracks in a substrate to be sealed. Also, strains are generated at boundaries between the filler particles and the glass composition, thus possibly causing cracks in the resulting seal.

(Glass Paste Composition)

When the sealing member or the coating member of the present invention is applied to a substrate, it is preferable to use a paste (glass paste composition) which is prepared by mixing, in a solvent, a powder containing the invented glass composition and a resin binder. Examples of usable resin binders include, but are not particularly limited to, nitrocellulose, ethyl cellulose, and methacrylate ester. Examples of usable solvents include, but are not particularly limited to, α-terpineol, diethylene glycol monobutyl ether, and diethylene glycol monobutyl ether acetate.

The present invention will be described below with reference to specific examples, but is not limited to these examples.

EXAMPLES

Examples 1-1 to 1-35 and Comparative Examples 1-1 to 1-23

Preparation of Glass Composition

There were prepared glass compositions (Examples 1-1 to 1-35 and Comparative Examples 1-1 to 1-23) having the compositions shown in Tables 1 and 2. The compositions shown in Tables 1 and 2 are expressed in terms of mass percent on the oxide basis. All the glass compositions do not contain JIG level A or B substances, but contain vanadium (V), phosphorus (P), and barium (Ba) as major constituents, and tungsten (W), zinc (Zn), and iron (Fe) as sub-constituents. The starting materials used were vanadium pentoxide ($V_2O_5$), phosphorus pentoxide ($P_2O_5$), barium carbonate ($BaCO_3$), tungsten trioxide ($WO_3$), zinc oxide (ZnO), and ferric oxide ($Fe_2O_3$).

The glass compositions were prepared as follows: First, various mixtures of powders were prepared by mixing the starting materials in the percentages shown in Tables 1 and 2. Next, 300 g of each mixture of powder was placed in a platinum crucible, heated in an electric furnace to 1100° C. at a rate of 5 to 10° C./min, and maintained at this temperature for 2 hrs while being stirred in order to form a uniform glass. Then, the platinum crucible was taken out from the electric furnace and the glass in the platinum crucible was poured over a stainless steel plate which was preheated to 200 to 300° C. Finally, the glass was milled using a stamping mill to obtain a powder of the glass composition.

(Evaluation and Measurement of Glass Composition)

The softening point and crystallization temperature of the glass composition samples were measured as follows: A differential thermal analyzer (DTA) (TG8120 available from Rigaku Co., Ltd.) was used. The reference material used was α-alumina. The weight of the reference material and each sample was 100 mg. The measurement was conducted in an air atmosphere and at a heating rate of 5° C./min. FIG. 2 shows an exemplary DTA curve obtained in the above-described DTA measurement. As shown in FIG. 2, the softening point of the glass composition sample was defined as the second endothermic peak temperature, and the crystallization temperature was defined as the starting temperature (determined by a tangent method) of the exothermic peak due to the crystallization. The results of the measurement are summarized in Tables 1 and 2.

The average linear expansion coefficient of the glass composition samples was measured as follows: The powder of each glass composition was pressed to form a compact of the glass composition. The thus obtained glass composition compact was maintained at a temperature 40° C. higher than its softening point for 30 min to fire the glass compact. Then, a 4 mm×4 mm×20 mm specimen for the linear expansion coefficient measurement was cut out from the fired glass compact by machining. The linear expansion coefficient of this specimen was measured using a thermal dilatometer (TMA8310 available from Rigaku Co., Ltd.) in an air atmosphere and at a heating rate of 5° C./min. The average linear expansion coefficient was determined from data over the temperature range from 30 to 250° C. The results of this measurement are also summarized in Tables 1 and 2.

The softening and flowing properties of the glass composition samples during heating was measured using a button flow test as follows: First, each glass composition powder having an average particle diameter of about 20 μm was pressed to form a 10-mm-diameter, 5-mm-thick pellet. This pellet was placed on a heat-resistant glass substrate, heated to 550° C. at a heating rate of 5° C./min, maintained for 10 min, and cooled to room temperature at a cooling rate of 5° C./min. The diameter of the thus heat-treated pellet was measured with vernier calipers to evaluate the fluidity. The results of this measurement are also summarized in Tables 1 and 2. In this measurement, with increasing temperature, the diameter of the pellet at first decreased to about 8.5 mm, and then increased. In consideration of this phenomenon, the following evaluation code was employed: When a test pellet had a diameter of 9.0 mm or more and exhibited sufficient glossiness after the above-described heat treatment, the fluidity of the glass composition used to form the pellet was evaluated to be good and was marked with a "G" symbol of "good". When a test pellet exhibited some degree of glossiness but had a diameter of 8.5 mm or more and less than 9.0 mm, the fluidity of the glass composition used to form the pellet was evaluated to be poor and was marked with a "P" symbol of "poor". When a test pellet exhibited no or little glossiness, the pellet was determined either to have not softened or to have crystallized and the fluidity of the glass composition used to form the pellet was marked with an "NG" symbol of "no good".

The electrical resistivity of the glass composition samples was measured as follows: First, a fired glass compact was formed from each glass composition powder in the same manner as used in the average linear expansion coefficient measurement. Then, a 15 mm×15 mm×5 mm specimen was cut out from the fired glass compact by machining. The electrical resistivity of the thus prepared specimen was measured by a double ring probe method using a high resistivity meter (Hiresta MCP-HT260 available from Mitsubishi Chemical Corp.) at a temperature of 25° C. and at an applied voltage of 100 V. The results of this measurement are also summarized in Tables 1 and 2.

The moisture resistance of the glass composition samples was evaluated as follows: Test specimens for moisture resistance evaluation were prepared in the same manner as used in the average linear expansion coefficient measurement. Each test specimen was kept at 85° C. and 85% relative humidity for 7 days, and then the change in appearance was observed with naked eyes. The moisture resistances of test specimen which underwent little or no appearance change were marked with a "G" symbol of "good". The moisture resistances of test specimen that underwent an apparent appearance change (e.g., discoloration or elution) were marked with an "NG" symbol of "no good". The results of this measurement are also summarized in Tables 1 and 2.

The chemical reactivity between the glass composition samples and a silver interconnection line was evaluated as follows: First, each glass frit composition was mixed with a resin binder (ethyl cellulose) in a solvent (butyl carbitol acetate) to prepare a glass paste composition. Next, a silver paste was screen printed on a heat-resistant glass substrate and heated to form a silver interconnection line (width of 100 μm, length of 50 mm, and thickness of 5 μm). Then, the thus prepared glass paste composition was applied over the silver interconnection line and heated to form a coating member (dielectric layer) made of the glass frit composition (width of 10 mm, length of 40 mm, and thickness of 10 μm). The electrical resistance of the silver interconnection lines was measured on a tester. When the electrical resistance of the silver interconnection line did not change significantly after the formation of the coating member (dielectric layer), the chemical reactivity of the glass composition with the silver interconnection line was marked with a "G" symbol of "good". When the electrical resistance of the silver interconnection line increased by more than one order of magnitude, the chemical reactivity of the glass composition with the silver interconnection line was marked with an "NG" symbol of "no good". The results of this measurement are also summarized in Tables 1 and 2.

TABLE 1

| | Composition (mass %) | | | | | | | | *3 | *4 | | |
| | $V_2O_5$ | $WO_3$ | $Fe_2O_3$ | $P_2O_5$ | BaO | ZnO | *1 | *2 | (/° C.) | (Ωcm) | *5 | *6 |
|---|---|---|---|---|---|---|---|---|---|---|---|---|
| Ex. 1-1 | 43 | 12 | 5 | 25 | 10 | 5 | 442° C. | C | 7.4 ppm | $10^8$ | G | G |
| Ex. 1-2 | 43 | 7 | 5 | 23 | 10 | 12 | 437° C. | G | 7.6 ppm | $10^8$ | G | G |
| Ex. 1-3 | 43 | 5 | 7 | 23 | 12 | 10 | 433° C. | G | 7.8 ppm | $10^8$ | G | G |
| Ex. 1-4 | 40 | 15 | 5 | 25 | 10 | 5 | 465° C. | G | 7.3 ppm | $10^9$ | G | G |
| Ex. 1-5 | 40 | 15 | | 25 | 10 | 10 | 468° C. | G | 7.2 ppm | $10^9$ | G | G |
| Ex. 1-6 | 40 | 10 | 5 | 23 | 12 | 10 | 452° C. | G | 7.6 ppm | $10^8$ | G | G |
| Ex. 1-7 | 40 | 10 | 5 | 25 | 10 | 10 | 455° C. | G | 7.7 ppm | $10^9$ | G | G |
| Ex. 1-8 | 40 | 10 | 5 | 25 | 15 | 5 | 462° C. | G | 7.8 ppm | $10^9$ | G | G |
| Ex. 1-9 | 40 | 10 | | 25 | 10 | 15 | 452° C. | G | 7.8 ppm | $10^9$ | G | G |
| Ex. 1-10 | 40 | 10 | | 25 | 20 | 5 | 471° C. | G | 8.0 ppm | $10^8$ | G | G |
| Ex. 1-11 | 40 | 5 | 10 | 25 | 10 | 10 | 451° C. | G | 6.6 ppm | $10^8$ | G | G |
| Ex. 1-12 | 40 | 5 | | 25 | 20 | 10 | 463° C. | G | 8.1 ppm | $10^8$ | G | G |
| Ex. 1-13 | 40 | 15 | | 30 | 10 | 5 | 482° C. | G | 7.6 ppm | $10^9$ | G | G |
| Ex. 1-14 | 40 | 10 | | 30 | 15 | 5 | 481° C. | G | 7.8 ppm | $10^9$ | G | G |
| Ex. 1-15 | 40 | 5 | 10 | 30 | 10 | 5 | 476° C. | G | 8.0 ppm | $10^8$ | G | G |
| Ex. 1-16 | 40 | 5 | | 30 | 15 | 10 | 484° C. | G | 8.3 ppm | $10^8$ | G | G |
| Ex. 1-17 | 40 | | | 30 | 15 | 15 | 477° C. | G | 8.8 ppm | $10^8$ | G | G |

TABLE 1-continued

| | Composition (mass %) | | | | | | *1 | *2 | *3 (/° C.) | *4 (Ωcm) | *5 | *6 |
|---|---|---|---|---|---|---|---|---|---|---|---|---|
| | $V_2O_5$ | $WO_3$ | $Fe_2O_3$ | $P_2O_5$ | BaO | ZnO | | | | | | |
| Ex. 1-18 | 37 | 18 | 5 | 23 | 10 | 7 | 475° C. | G | 6.2 ppm | $10^9$ | G | G |
| Ex. 1-19 | 37 | 15 | 5 | 23 | 10 | 10 | 472° C. | G | 7.8 ppm | $10^9$ | G | G |
| Ex. 1-20 | 37 | 10 | 5 | 25 | 13 | 10 | 478° C. | G | 7.9 ppm | $10^9$ | G | G |
| Ex. 1-21 | 35 | 20 | | 25 | 15 | 5 | 518° C. | G | 6.2 ppm | $10^9$ | G | G |
| Ex. 1-22 | 35 | 20 | | 25 | 10 | 5 | 525° C. | G | 6.2 ppm | $10^9$ | G | G |
| Ex. 1-23 | 35 | 15 | 10 | 25 | 10 | 5 | 508° C. | G | 6.9 ppm | $10^8$ | G | G |
| Ex. 1-24 | 35 | 15 | | 25 | 15 | 10 | 512° C. | G | 6.8 ppm | $10^8$ | G | G |
| Ex. 1-25 | 35 | 10 | 10 | 25 | 10 | 10 | 492° C. | G | 7.2 ppm | $10^9$ | G | G |
| Ex. 1-26 | 35 | 10 | | 25 | 15 | 15 | 498° C. | G | 6.7 ppm | $10^9$ | G | G |
| Ex. 1-27 | 35 | 5 | | 30 | 20 | 10 | 507° C. | G | 7.0 ppm | $10^9$ | G | G |
| Ex. 1-28 | 35 | | 10 | 30 | 20 | 5 | 510° C. | G | 7.2 ppm | $10^9$ | G | G |
| Ex. 1-29 | 30 | 25 | | 30 | 10 | 5 | 527° C. | G | 6.2 ppm | $10^9$ | G | G |
| Ex. 1-30 | 30 | 10 | 10 | 30 | 10 | 10 | 503° C. | G | 6.9 ppm | $10^9$ | G | G |
| Ex. 1-31 | 30 | 10 | 5 | 30 | 15 | 10 | 508° C. | G | 6.8 ppm | $10^9$ | G | G |
| Ex. 1-32 | 30 | 10 | | 30 | 15 | 15 | 511° C. | G | 6.8 ppm | $10^9$ | G | G |
| Ex. 1-33 | 30 | 10 | 10 | 25 | 15 | 10 | 494° C. | G | 7.5 ppm | $10^9$ | G | G |
| Ex. 1-34 | 25 | 25 | 10 | 25 | 5 | 10 | 503° C. | G | 6.5 ppm | $10^{10}$ | G | G |
| Ex. 1-35 | 25 | 10 | 10 | 30 | 15 | 10 | 522° C. | G | 7.6 ppm | $10^{10}$ | G | G |

*1: Softening Point,
*2: Fluidity at 550° C.,
*3: Average Linear Expansion Coefficient,
*4: Order of Magnitude of Electrical Resistivity,
*5: Chemical Reactivity with Ag Interconnection Line,
*6: Moisture Resistance, and
Ex.: Example.

TABLE 2

| | Composition (mass %) | | | | | | *1 | *2 | *3 (/° C.) | *4 (Ωcm) | *5 | *6 |
|---|---|---|---|---|---|---|---|---|---|---|---|---|
| | $V_2O_5$ | $WO_3$ | $Fe_2O_3$ | $P_2O_5$ | BaO | ZnO | | | | | | |
| Cm. Ex. 1-1 | 55 | | | 25 | 10 | 10 | 422° C. | NG (*7) | 8.2 ppm | $10^6$ | NG | NG |
| Cm. Ex. 1-2 | 50 | 10 | 5 | 20 | 10 | 5 | 427° C. | NG (*7) | 8.3 ppm | $10^7$ | NG | NG |
| Cm. Ex. 1-3 | 45 | 12 | 5 | 23 | 10 | 5 | 434° C. | G | 8.0 ppm | $10^7$ | NG | NG |
| Cm. Ex. 1-4 | 45 | 15 | 5 | 25 | 5 | 5 | 440° C. | G | 7.9 ppm | $10^7$ | NG | NG |
| Cm. Ex. 1-5 | 45 | 5 | 10 | 15 | 10 | 15 | 438° C. | NG (*7) | 9.8 ppm | $10^7$ | NG | NG |
| Cm. Ex. 1-6 | 45 | 10 | | 22 | 15 | 8 | 437° C. | NG (*7) | 8.7 ppm | $10^7$ | NG | NG |
| Cm. Ex. 1-7 | 45 | 8 | | 25 | 22 | | 442° C. | G | 9.3 ppm | $10^7$ | NG | NG |
| Cm. Ex. 1-8 | 40 | 15 | 5 | 27 | 10 | 3 | 474° C. | G | 7.2 ppm | $10^8$ | G | NG |
| Cm. Ex. 1-9 | 40 | 2 | 10 | 25 | 5 | 18 | 442° C. | NG (*7) | 7.4 ppm | $10^8$ | G | G |
| Cm. Ex. 1-10 | 40 | 15 | 5 | 25 | 3 | 12 | 468° C. | G | 7.8 ppm | $10^8$ | G | NG |
| Cm. Ex. 1-11 | 40 | 15 | 5 | 25 | | 15 | 462° C. | G | 7.7 ppm | $10^8$ | G | NG |
| Cm. Ex. 1-12 | 40 | | 15 | 25 | 10 | 10 | 441° C. | NG (*7) | 8.0 ppm | $10^7$ | NG | G |
| Cm. Ex. 1-13 | 40 | 15 | 10 | 20 | 10 | 10 | 437° C. | G | 7.8 ppm | $10^8$ | G | NG |
| Cm. Ex. 1-14 | 40 | 15 | 10 | 15 | 10 | 15 | 431° C. | NG (*7) | 7.6 ppm | $10^7$ | NG | NG |
| Cm. Ex. 1-15 | 40 | 30 | | 25 | | 5 | 477° C. | G | 5.8 ppm | $10^8$ | G | NG |
| Cm. Ex. 1-16 | 35 | | | 35 | 15 | 10 | 542° C. | NG (*8) | 7.6 ppm | $10^8$ | G | G |
| Cm. Ex. 1-17 | 35 | | | 33 | 17 | 10 | 538° C. | P | 7.6 ppm | $10^8$ | G | G |
| Cm. Ex. 1-18 | 35 | 5 | | 30 | 25 | 5 | 537° C. | P | 7.1 ppm | $10^9$ | G | G |
| Cm. Ex. 1-19 | 30 | 5 | | 30 | 25 | 10 | 532° C. | P | 7.0 ppm | $10^9$ | G | G |
| Cm. Ex. 1-20 | 25 | 30 | | 25 | 15 | 5 | 537° C. | NG (*8) | 5.9 ppm | $10^8$ | G | G |
| Cm. Ex. 1-21 | 25 | 40 | | 25 | 5 | 5 | 551° C. | NG (*8) | 5.6 ppm | $10^8$ | G | G |
| Cm. Ex. 1-22 | 23 | 25 | 10 | 27 | 5 | 10 | 533° C. | P | 6.4 ppm | $10^{10}$ | G | G |
| Cm. Ex. 1-23 | 20 | 25 | 10 | 30 | 5 | 10 | 557° C. | NG (*8) | 6.2 ppm | $10^{10}$ | G | G |

*1: Softening Point,
*2: Fluidity at 550° C.,
*3: Average Linear Expansion Coefficient,
*4: Order of Magnitude of Electrical Resistivity,
*5: Chemical Reactivity with Ag Interconnection Line,
*6: Moisture Resistance,
*7: Crystallized,
*8: Not Melted, and
Cm. Ex.: Comparative Example.

As shown in Table 1, the glass compositions of Examples 1-1 to 1-35 contained phosphorus, barium, zinc, and at least one metal selected from the group consisting of vanadium, tungsten, and iron, and did not contain substances on the JIG level A or B list. They had a softening point of 430 to 530° C., and therefore exhibited good fluidity at 550° C. Their average linear expansion coefficients were 6 to 9 ppm/° C. at temperatures from 30 to 250° C. They also exhibited good moisture resistance. In addition, their electrical resistances were $10^8$ to $10^{10}$ Ω·cm at a temperature of 25° C. Also, they did not chemically react with the silver interconnection line.

It can be seen from Table 1 that the glass composition of the invention preferably contains on the oxide basis: 25 to 43 mass % of $V_2O_5$; 0 to 25 mass % of $WO_3$; 0 to 10 mass % of $Fe_2O_3$; 23 to 30 mass % of $P_2O_5$; 5 to 20 mass % of BaO; and 5 to 15 mass % of ZnO, with the total content of the $V_2O_5$, the $WO_3$, and the $Fe_2O_3$ ranging from 40 to 60 mass %.

In contrast, as can be seen from Comparative Examples 1-1 to 1-7 in Table 2, when a glass composition contained more than 43 mass % of $V_2O_5$, it had a lower softening point and easily crystallized. It also had a lower electrical resistivity and chemically reacted with the silver interconnection line. In addition, the glass compositions of Comparative Examples 1-5 and 1-7 had an undesirably high average linear expansion coefficient. On the other hand, as can be seen from Comparative Examples 1-22 and 1-23, when a glass composition contained less than 25 mass % of $V_2O_5$, it had a higher softening point and could not provide sufficient fluidity.

As can be seen from Comparative Examples 1-15, 1-20, and 1-21, when a glass composition contained more than 25 mass % of $WO_3$, it had a higher softening point and could not provide sufficient fluidity. It also had an undesirably low average linear expansion coefficient.

As can be seen from Comparative Example 1-12, when a glass composition contained more than 10 mass % of $Fe_2O_3$, it easily crystallized, had a lower electrical resistivity, and chemically reacted with the silver interconnection line.

As can be seen from Comparative Examples 1-16 and 1-17, when a glass composition contained more than 30 mass % of $P_2O_5$, it had a higher softening point and could not provide sufficient fluidity. On the other hand, as can be seen from Comparative Examples 1-13 and 1-14, when a glass composition contained less than 23 mass % of $P_2O_5$, it easily crystallized and could not provide good moisture resistance.

As can be seen from Comparative Examples 1-18 and 1-19, when a glass composition contained more than 20 mass % of BaO, it had a higher softening point. On the other hand, as can be seen from Comparative Examples 1-10 and 1-11, when a glass composition contained less than 5 mass % of BaO, it had poor moisture resistance.

As can be seen from Comparative Example 1-9, when a glass composition contained more than 15 mass % of ZnO, it easily crystallized. On the other hand, as can be seen from Comparative Example 1-8, when a glass composition contained less than 5 mass % of ZnO, its moisture resistance was poor.

The following can be concluded from the above results: The glass composition of the present invention does not contain JIG level A or B substances, has good fluidity and moisture resistance, does not chemically react with the silver electrodes, and has good antistatic properties. Therefore, the invented glass composition can be advantageously used to form a coating member (dielectric layer) for covering the back panel of a PDP, and also green (environmentally friendly) designs can be achieved.

Examples 2-1 to 2-9 and Comparative Examples 2-1 to 2-6

Preparation of Sealing Member

Next, examples of sealing members (sealants) formed by mixing a glass composition and a filler will be described.

Various sealants containing the constituents in the volume percentages as shown in Tables 3 and 4 were prepared (Examples 2-1 to 2-9 and Comparative Examples 2-1 to 2-6). Powders of the glass compositions of Examples 1-15, 1-17, and 1-18 in Table 1 and Comparative Examples 1-7 and 1-15 in Table 2 were used. The following fillers were mixed with the glass composition powders: amorphous silica powders with average particle diameters of 3 μm, 5 μm and 10 μm; an alumina powder with an average particle diameter of 27 μm; cordierite powders with average particle diameters of 20 μm, 38 μm and 43 μm; a mullite powder with an average particle diameter of 25 μm; a β-eucryptite powder with an average particle diameter of 12 μm; and a zirconium phosphate powder with an average particle diameter of 18 μm.

Each glass composition powder was mixed with one of the filler powders in the volume percentages shown in Tables 3 and 4. Then, the mixture powder was further mixed with a resin and a solvent to form a glass paste composition for sealing (glass sealant paste). Butyl carbitol acetate was used as the solvent, and ethyl cellulose was used as the resin.

(Sealing Procedure)

A 100 mm×10 mm×3 mm glass substrate (PD200 available from Asahi Glass Co., Ltd., average linear expansion coefficient=8.3 ppm/° C.) provided with an evacuation pipe was used. Each glass sealant paste was applied along the periphery of the glass substrate with a dispenser and was dried to form a coating 2 mm wide and 500 μm thick. Next, the coating was pre-fired by heating to 530° C. at a rate of 5° C./min, maintaining this temperature for 10 min and cooling to room temperature at a rate of 3° C./min. Then, this glass substrate and another glass substrate of the same size were joined and fixed by means of clips. And then, the evacuation pipe was connected to a vacuum pump. After that, the bonded glass substrates were heated to 500° C. at a rate of 5° C./min, maintained at this temperature for 30 min, evacuated, and maintained for another 1 hour. Finally, the glass substrates were cooled to room temperature at a rate of 3° C./min, thereby completing the sealing of the periphery of the glass substrates.

(Measurement of Average Linear Expansion Coefficient of Sealing Member and Evaluation of Sealing Condition)

The average linear expansion coefficient of the sealing members containing the volume percentages of the constituents shown in Tables 3 and 4 was measured in the same manner as described above in Example 1. The results are summarized in Tables 3 and 4. Also, for each sealing member, the sealing condition of the above-described seal along the periphery of the bonded glass substrates was evaluated by observation with the naked eyes. When there were no defects in the glass substrates or the resulting seal; and a good airtight seal was obtained, the sealing condition was marked with a "G" symbol of "good". When cracks occurred in the glass substrates or the seal; or the sealing member was sucked off during the evacuation process; or an airtight seal could not be achieved due to insufficient softening of the sealing member, the sealing condition was marked with an "NG" symbol of "no good". The results are also summarized in Tables 3 and 4.

TABLE 3

| Composition (vol. %) | | Ex. 2-1 | Ex. 2-2 | Ex. 2-3 | Ex. 2-4 | Ex. 2-5 | Ex. 2-6 | Ex. 2-7 | Ex. 2-8 | Ex. 2-9 |
|---|---|---|---|---|---|---|---|---|---|---|
| Glass Composition | Ex. 1-18 | | | 70 | | | | | | |
| | Ex. 1-15 | 90 | 60 | | | | | 85 | 85 | 85 |
| | Ex. 1-17 | | | | 70 | 70 | 70 | | | |
| | Cm. Ex. 1-15 | | | | | | | | | |
| | Cm. Ex. 1-7 | | | | | | | | | |

TABLE 3-continued

| Composition (vol. %) | | | Ex. 2-1 | Ex. 2-2 | Ex. 2-3 | Ex. 2-4 | Ex. 2-5 | Ex. 2-6 | Ex. 2-7 | Ex. 2-8 | Ex. 2-9 |
|---|---|---|---|---|---|---|---|---|---|---|---|
| Filler | Amorphous Silica | 3 μm | | | | | | | | | |
| | | 5 μm | | | | | 30 | | | | |
| | | 10 μm | | | | | | 30 | | | |
| | Alumina | 27 μm | | 25 | 30 | | | | | | |
| | Cordierite | 30 μm | | 15 | | | | | 15 | | |
| | | 38 μm | | | | | | | | 15 | |
| | | 43 μm | | | | | | | | | |
| | Mullite | 25 μm | | | | 30 | | | | | |
| | β-Eucryptite | 12 μm | 10 | | | | | | | | |
| | Zirconium Phosphate | 18 μm | | | | | | | | | 15 |
| Average Linear Expansion Coefficient (/° C.) | | | 6.8 ppm | 7.0 ppm | 6.7 ppm | 7.2 ppm | 7.1 ppm | 6.8 ppm | 7.0 ppm | 6.5 ppm | 6.9 ppm |
| Sealing Condition | | | G Good | G Good | G Good | G Good | G Good | G Good | G Good | G Good | G Good |

Ex.: Example, and
Cm. Ex.: Comparative Example.

TABLE 4

| Composition (vol. %) | | | Cm. Ex. 2-1 | Cm. Ex. 2-2 | Cm. Ex. 2-3 | Cm. Ex. 2-4 | Cm. Ex. 2-5 | Cm. Ex. 2-6 |
|---|---|---|---|---|---|---|---|---|
| Glass Composition | Ex. 1-18 | | | | | | | |
| | Ex. 1-15 | | | | 95 | 55 | | 85 |
| | Ex. 1-17 | | | | | | 70 | |
| | Cm. Ex. 1-15 | | 85 | | | | | |
| | Cm. Ex. 1-7 | | | 60 | | | | |
| Filler | Amorphous Silica | 3 μm | | | | | | |
| | | 5 μm | | | | | 30 | |
| | | 10 μm | | 40 | | | | |
| | Alumina | 27 μm | 15 | | | 30 | | |
| | Cordierite | 30 μm | | | | 15 | | |
| | | 38 μm | | | | | | |
| | | 43 μm | | | | | | 15 |
| | Mullite | 25 μm | | | | | | |
| | β-Eucryptite | 12 μm | | | 5 | | | |
| | Zirconium Phosphate | 18 μm | | | | | | |
| Average Linear Expansion Coefficient (/° C.) | | | 6.2 ppm | 7.1 ppm | 7.4 ppm | 7.0 ppm | 7.7 ppm | 6.8 ppm |
| Sealing Condition | | | NG Crack | NG Crack | NG Sucking | NG *9 | NG Crack | NG *10 |

*9: Insufficient Sealing,
*10: Insufficient Adhesion,
Ex.: Example, and
Cm. Ex.: Comparative Example.

As shown in Table 3, the sealing members of Examples 2-1 to 2-9 had an average linear expansion coefficient of 6.3 to 7.3 ppm/° C. at temperatures from 30 to 250° C. It was also shown that when the content of the glass composition was 60 to 90 vol. %; and the content of the filler was 10 to 40 vol. %; and the average particle diameter of the filler was 5 to 40 μm, no defects (such as cracks) occurred in the glass substrates or the resulting seal, and a satisfactory airtight seal was obtained.

By contrast as shown in Table 4, in Comparative Example 2-1, cracks occurred in the glass substrate. This is probably because when the average linear expansion coefficient of the glass composition contained in a sealing member was less than 6 ppm/° C. (see, e.g., Comparative Example 1-15), the average linear expansion coefficient of the sealing member (Comparative Example 2-1) could not be adjusted to a proper range (6.3 ppm/° C. or more) by the addition of the filler.

On the other hand, as can be seen from Comparative Example 2-2, when the average linear expansion coefficient of the glass composition contained in a sealing member was more than 9 ppm/° C. (see, e.g., Comparative Example 1-7), cracks occurred in the sealing member, and a satisfactory airtight seal could not be achieved. This is probably because the average linear expansion coefficient of the sealant could not be adjusted to a proper range (7.3 ppm/° C. or less) by the addition of the filler and therefore an excessive tensile stress was loaded to the sealing member.

Comparative Example 2-3 shows that when the content of the filler was less than 10 vol. %, the fluidity of the sealing member was too high during heating and therefore the sealing member was sucked off during the evacuation process, thus failing to obtain an airtight seal. On the other hand, as seen from Comparative Example 2-4, when the content of the filler was more than 40 vol. %, the fluidity of the sealing member was too low during heating, and therefore a satisfactory airtight seal was not obtained.

As shown in Comparative Example 2-5, when the average particle diameter of the filler was smaller than 5 μm, the following problems arose. First, the specific surface of the filler was too high, resulting in poor fluidity of the sealing member during heating. Therefore, a larger amount of the filler particles were exposed to a surface of the sealing member after the pre-firing process, thereby increasing a contact area between the filler particles and the glass substrate. As a result, Comparative Example 2-5 did not sufficiently adhere to the glass substrate during the sealing procedure.

On the other hand, as shown in Comparative Example 2-6, when the average particle diameter of the filler was larger than 40 μm, cracks occurred in the resulting seal, thus failing to obtain a satisfactory airtight seal. This is probably because too large an average particle diameter of the filler developed high strains at boundaries between the glass composition and the filler particles.

The results above demonstrate the following: A satisfactory seal can be achieved by using the sealing member of the present invention. Also, the invented sealing member (the invented glass composition) does not contain substances included in the JIG level A and B lists, and therefore green (environmentally friendly) designs can be achieved.

While the coating and sealing members of the invention have been specifically described for use in display devices such as PDPs, the present invention is not limited to such specific applications, but can also be applied to other electronic devices such as IC ceramic packages, X-ray tubes, and ozone generators. In addition, the glass composition of the invention can also be applied to purposes other than coating and sealing. Furthermore, products that comply with the environment and safety regulations can be achieved by using the glass composition of the invention.

The invention claimed is:

1. A glass composition, comprising: transition metals; phosphorus (P); barium (Ba); and zinc (Zn), the transition metals including; vanadium (V) and at least one of tungsten (W) and iron (Fe), the glass composition not containing substances included in the JIG level A and B lists and not containing alkali metals, a softening point of the glass composition being from 430 to 530° C., an average linear expansion coefficient of the glass composition being from 6 to 9 ppm/° C. at temperatures from 30 to 250° C.

2. The glass composition according to claim 1, wherein an electrical resistivity of the glass composition is from $10^8$ to $10^{10}$ Ω·cm at a temperature of 25° C.

3. A glass paste composition, comprising: a resin; a solvent; and a powder of the glass composition according to claim 1 as a major constituent.

4. A sealing member, comprising the glass composition according to claim 1 as a major constituent.

5. The sealing member according to claim 4, further comprising a filler powder, wherein: content of the glass composition is from 60 to 90 vol. %; and content of the filler powder is from 10 to 40 vol. %.

6. The sealing member according to claim 5, wherein an average particle diameter of the filler powder is from 5 to 40 μm.

7. A coating member, comprising the glass composition according to claim 1 as a major constituent.

8. An electronic device, comprising:
a glass sealant which seals a portion of the electronic device, the glass sealant containing the glass composition according to claim 1;
a glass adhesive that bonds different portions of the electronic device, the glass adhesive containing the glass composition; or
a glass coating that coats a portion of the electronic device, the glass coating containing the glass composition.

9. The electronic device according to claim 8, wherein the electronic device is a display device, an IC ceramic package, an X-ray tube, or an ozone generator.

10. The glass composition according to claim 1, wherein the glass composition consists essentially of oxides of: transition metals; phosphorus (P); barium (Ba); and zinc (Zn), the transition metals including vanadium (V) and at least one of tungsten (W) and iron (Fe).

11. A glass composition, comprising: transition metals; phosphorus (P); barium (Ba); and zinc (Zn), the transition metals including vanadium (V) and at least one of tungsten (W) and iron (Fe), the glass composition containing, on the oxide basis: 25 to 43 mass % of $V_2O_5$; 0 to 25 mass % of $WO_3$; 0 to 10 mass % of $Fe_2O_3$; 23 to 30 mass % of $P_2O_5$; 5 to 20 mass % of BaO; and 5 to 15 mass % of ZnO, a total content of the $V_2O_5$, the $WO_3$, and the $Fe_2O_3$ being within a range from 40 to 60 mass %, the glass composition not containing substances included in the JIG level A and B lists and not containing alkali metals.

12. The glass composition according to claim 11, wherein: a softening point of the glass composition is from 430 to 530° C.; and an electrical resistivity of the glass composition is from $10^8$ to $10^{10}$ Ω·cm at a temperature of 25° C.

13. A glass paste composition, comprising: a resin; a solvent; and a powder of the glass composition according to claim 11 as a major constituent.

14. A sealing member, comprising the glass composition according to claim 11 as a major constituent.

15. The sealing member according to claim 14, further comprising a filler powder, wherein: content of the glass composition is from 60 to 90 vol. %; and content of the filler powder is from 10 to 40 vol. %.

16. The sealing member according to claim 15, wherein an average particle diameter of the filler powder is from 5 to 40 μm.

17. A coating member, comprising the glass composition according to claim 11 as a major constituent.

18. An electronic device, comprising:
a glass sealant which seals a portion of the electronic device, the glass sealant containing the glass composition according to claim 11;
a glass adhesive that bonds different portions of the electronic device, the glass adhesive containing the glass composition; or
a glass coating that coats a portion of the electronic device, the glass coating containing the glass composition.

19. The electronic device according to claim 18, wherein the electronic device is a display device, an IC ceramic package, an X-ray tube, or an ozone generator.

20. The glass composition according to claim 11, wherein the glass composition consists essentially of oxides of: transition metals; phosphorus (P); barium (Ba); and zinc (Zn), the transition metals including vanadium (V) and at least one of tungsten (W) and iron (Fe).

* * * * *